United States Patent
Leavitt et al.

(10) Patent No.: US 7,609,738 B2
(45) Date of Patent: Oct. 27, 2009

(54) MULTIPLE PHONON RESONANCE QUANTUM CASCADE LASERS

(75) Inventors: Richard P. Leavitt, Silver Spring, MD (US); John L. Bradshaw, Elkridge, MD (US)

(73) Assignee: Maxion Technologies, Inc., Hyattsville, MD (US)

(*) Notice: Subject to any disclaimer, the term of this patent is extended or adjusted under 35 U.S.C. 154(b) by 58 days.

(21) Appl. No.: 11/929,061

(22) Filed: Oct. 30, 2007

(65) Prior Publication Data

US 2008/0232413 A1 Sep. 25, 2008

Related U.S. Application Data

(60) Provisional application No. 60/855,231, filed on Oct. 30, 2006.

(51) Int. Cl.
*H01S 5/00* (2006.01)
(52) U.S. Cl. ............... 372/43.01; 372/44.01; 372/45.01
(58) Field of Classification Search .............. 372/43.01, 372/44.01
See application file for complete search history.

(56) References Cited

U.S. PATENT DOCUMENTS

| 4,622,671 A | 11/1986 | Tsang |
| 5,333,141 A | 7/1994 | Wolf et al. |
| 5,457,709 A | 10/1995 | Capasso et al. |
| 5,588,015 A | 12/1996 | Yang |
| 5,594,750 A | 1/1997 | Zhang et al. |
| 5,793,787 A | 8/1998 | Meyer et al. |

(Continued)

FOREIGN PATENT DOCUMENTS

WO WO 01/26192 A1 4/2001

(Continued)

OTHER PUBLICATIONS

Bose et al., "Electron velocity in indium phosphide single-heterojunction quantum wells", Semicond. Sci. Technol., 1991, pp. 1135-1140, vol. 6.

(Continued)

*Primary Examiner*—Dung T Nguyen
(74) *Attorney, Agent, or Firm*—Alan G. Towner, Esq.; Pietragallo Gordon Alfano Bosick & Raspanti, LLP

(57) ABSTRACT

Quantum-cascade lasers are provided with an active section in which relaxation of carriers from a lower laser level is provided by three or more phonon-assisted transitions to levels within the active section whose energies are below the energy of the lower laser level. The gain region of the laser consists of alternating active and injector sections, with an injection barrier inserted between each injector section and the adjacent active section, and an exit barrier inserted between each active section and the adjacent injector section. The active section comprises a sufficient number of quantum wells separated by quantum barriers to produce the desired energy-level structure consisting of an upper laser level, a lower laser level, and at least three levels that have lower energies than the lower laser level, with the separation of adjacent energy levels below and including the lower laser level that are at least equal to the energy of the quantum well material's longitudinal optical phonon.

8 Claims, 2 Drawing Sheets

U.S. PATENT DOCUMENTS

| | | | |
|---|---|---|---|
| 5,799,026 | A | 8/1998 | Meyer et al. |
| 6,324,199 | B1 * | 11/2001 | Capasso et al. .......... 372/45.01 |
| 6,404,791 | B1 | 6/2002 | Yang |
| 6,500,688 | B2 | 12/2002 | Bruno et al. |
| 6,553,045 | B2 | 4/2003 | Kaspi |
| 6,625,195 | B1 | 9/2003 | Henrichs |
| 6,751,244 | B2 | 6/2004 | Faist et al. |
| 7,408,966 | B2 * | 8/2008 | Botez ...................... 372/45.01 |
| 2004/0223528 | A1 | 11/2004 | Wortman et al. |
| 2004/0223529 | A1 | 11/2004 | Bruno et al. |
| 2006/0056466 | A1 | 3/2006 | Belenky et al. |
| 2007/0008999 | A1 | 1/2007 | Breznay et al. |
| 2007/0248131 | A1 * | 10/2007 | Botez et al. ............. 372/43.01 |

FOREIGN PATENT DOCUMENTS

| | | |
|---|---|---|
| WO | WO 03/023912 A2 | 3/2003 |

OTHER PUBLICATIONS

Knodl et al., "CW Room Temperature Operation of a Diode Cascade VCSEL", Annual Report 1999, Dept. of Optoelectronics, University of Ulm, pp. 90-93.

Knodl et al, "Bipolar Cascade VCSEL with 130% Differential Quantum Efficiency", Annual Report 2000, University of Ulm, pp. 11-14.

Felix et al., "Mid-infrared W quantum-well lasers for noncryogenic continuous-wave operation", Applied Optics, Feb. 20, 2001, pp. 806-811, vol. 40, No. 6.

* cited by examiner

MULTIPLE PHONON RESONANCE QUANTUM CASCADE LASERS

CROSS-REFERENCE TO RELATED APPLICATION

This application claims the benefit of U.S. Provisional Application No. 60/855,231 filed Oct. 30, 2006, which is incorporated herein by reference.

GOVERNMENT CONTRACT

The United States Government has certain rights to this invention pursuant to Contract No. W15P7T-06-C-P256 awarded by the U.S. Army Communications-Electronics Research, Development, and Engineering Center.

FIELD OF THE INVENTION

The present invention relates to quantum cascade lasers with active sections including multiple quantum wells which produce a desired energy level structure.

BACKGROUND INFORMATION

In lasers such as those disclosed in U.S. Pat. Nos. 5,457,709 and 6,751,244, electrons are extracted by resonance with one or two optical phonons. In U.S. Pat. No. 5,457,709, the electrons can occupy several subbands in each well, e.g., an upper subband, a middle subband, and a lower subband. The upper subband F corresponds to the injection energy of the electrons. The active electrons start from this subband. These electrons generate laser radiation upon passing into the middle subband G. In order for stimulated emission to take place, it is necessary for the population of the upper subband F to be greater than that of the population of the middle subband G, which can be obtained by resonance with an optical phonon. This resonance may be obtained provided that the energy difference between the middle subband G and the lower subband H corresponds, upon transition of an electron, to an energy loss $E_{GH}$ which is substantially equal to the energy of the optical phonons emitted by the single crystal material of a well.

U.S. Pat. No. 6,751,244 discloses that the properties of a laser may be improved by using resonance with two phonons. In the disclosed configuration, the electrons may occupy a fourth subband J, called the second lower subband. The energy difference between the first and second lower subbands H and J corresponds, upon transition of an electron, to an energy loss $E_{HJ}$ which is substantially equal to $E_{GH}$ and, consequently, to the energy of the optical phonons emitted.

SUMMARY OF THE INVENTION

The present invention provides quantum-cascade lasers with additional lower subbands which are in turn separated from the preceding lower subbands by an energy roughly equal to the longitudinal optical (LO) phonon energy. The additional subbands do not compromise the performance of the laser, but rather provide significantly improved overall performance.

In accordance with the present invention, the performance of quantum-cascade (QC) lasers is improved by using an active section for the laser with relaxation of carriers from the lower laser level provided by means of three or more phonon-assisted transitions to levels within the active section whose energies are below the energy of the lower laser level. The gain or active region of the laser consists of alternating active and injector sections, with a quantum barrier (QB) known as an injection barrier inserted between each injector section and the ensuing adjacent active section, and another QB known as an exit barrier inserted between each active section and the ensuing adjacent injector section. The active section comprises a sufficient number of quantum wells (QWs) separated by QBs to produce the desired energy-level structure consisting of an upper laser level, a lower laser level, and at least three levels that have lower energies than the lower laser level, with the separation of adjacent energy levels below and including the lower laser level that are at least equal to the energy of the QW material's longitudinal optical phonon, to allow for rapid relaxation of carriers by means of phonon-assisted transitions. In one embodiment, the active section comprises at least five QWs separated by QBs. However, any other suitable number of quantum wells may be used as long as they provide the above-noted energy level structure. The injector section is comprised of any number of QWs separated by QBs, with appropriate conditions being satisfied to properly connect sequential active sections.

An aspect of the present invention is to provide a quantum cascade laser comprising an active section, barrier layers on opposite sides of the active section forming a waveguide that provides optical confinement for the active section, and current injectors structured and arranged to apply an electric control field to the active section. The active section comprises a plurality of quantum wells separated by quantum barriers which produce an energy level structure including: an upper laser level; a lower laser level; and at least three additional laser levels having lower energies than an energy of the lower laser level, wherein the energy levels of adjacent ones of the three additional laser levels and the energy of the lower laser level have differences that are equal to or greater than an energy of a longitudinal optical phonon of a material of the quantum wells.

In one embodiment of the present invention, the gain region of the QC laser is sandwiched between two confining layers that have lower indices of refraction at the laser's operating wavelength than that of the gain region, providing an optical waveguide. One or more layers are deposited on the waveguide structure to allow electrical contact to the laser, thereby allowing current to flow.

Another embodiment of the invention provides QC lasers which further comprise a substrate upon which the layers are placed. The substrate may comprise, for example, InP.

A further embodiment of the invention provides QC lasers in which the QW material is InGaAs and the QB material is chosen from InAlAs, InP and AlGaAs. The lattice parameter of the QW material is greater than that of the substrate and the lattice parameter of the QB material is less than that of the substrate.

Another embodiment of the invention provides QC lasers in which the confining layer that is opposite from the substrate has a structure defining a diffraction grating having a period equal to a multiple of one half of the wavelength of light in the material, forming a distributed-feedback laser (DFB).

A further embodiment of the invention provides QC lasers in which layers of material such as InP that are electrically insulated or of opposite polarity from that of the laser's gain region are deposited on either side of the gain region, forming a buried-heterostructure (BH) laser.

DETAILED DESCRIPTION

The present invention provides an active section for quantum-cascade (QC) lasers containing multiple quantum wells (QWs). The thicknesses of the QWs, and those of the quantum barriers (QBs) that are placed between adjacent QWs, are chosen so that carriers relax from a lower laser level by means of multiple (more than two) nonradiative transitions assisted by longitudinal optical (LO) phonons to levels within the active section whose energies are lower than that of the lower laser level. The present invention provides improvement in QC laser gain by virtue of the faster relaxation of carriers from the lower laser level. Operation of the laser at lower electric fields is achieved compared with those used for existing QC laser designs, leading to the capability of designing matching injectors with lower carrier leakage from the upper laser level and correspondingly lower threshold currents and higher slope efficiencies at high operating temperatures.

Figure 1:
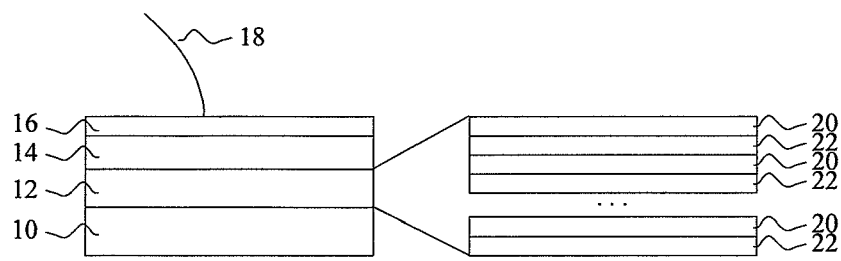
FIG. 1 is a partially schematic sectional view of a QC laser according to an embodiment of the invention, in which the QC laser is unipolar and the electrons are the charge carriers.

FIG. 1 shows, schematically and by way of example, a section through a unipolar type QC laser according to an embodiment of the invention, in which the electrons are the charge carriers. The laser comprises a substrate (not shown) such as single crystal indium phosphide (InP) upon which is deposited a lower waveguide structure 10, an active/gain region 12 having a stratified structure, an upper waveguide structure 14, and an electrode 16. The substrate may be fastened to a support (not shown). One or more wires 18 are connected to the electrode 16. The laser is powered by applying a voltage between the support and the wire 18. The waveguide structures 10 and 14 may be formed from layers consisting of alloys of indium and gallium arsenide (InGaAs), with a ratio of 53% indium arsenide to 47% gallium arsenide, and of indium and aluminum arsenide (InAlAs), with a ratio of 52% aluminum arsenide to 48% aluminum arsenide. Such compositions make it possible to provide a crystal structure having the same lattice parameter as that of the InP substrate.

As can be seen in the expanded part of FIG. 1, the active/gain region 12 comprises a sequence of alternating sections 20 and 22, referred to as active sections and injection sections, respectively, which are themselves formed from layers 24 of a first type and from layers 26 of a second type, placed alternately. Each pair of sections 20 and 22 within the active/gain region 12 is referred to as a stage.

Each of the layers 24, which forms a QB, mainly consists of an AlInAs alloy having the same composition as the corresponding layers in the waveguide structures in 10 and 14. Each of the layers 26, which forms a QW, mainly consists of an InGaAs alloy having the same composition as the corresponding layers in the waveguide structures in 10 and 14.

Figure 2:
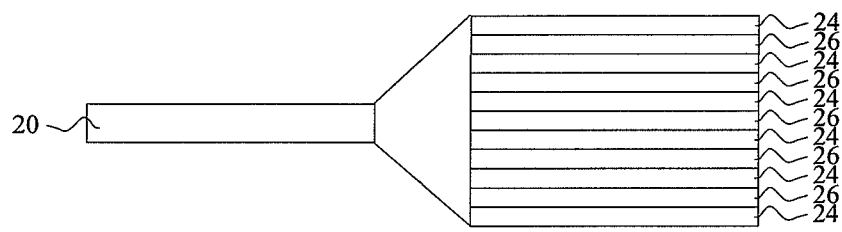
FIG. 2 illustrates one of the active sections of a QC laser in accordance with an embodiment of the invention.

FIG. 2 shows, schematically and by way of example, one of the active sections 20 of the QC laser according to the invention. The first and last QBs 24 in the active section (top and bottom layers in FIG. 2) are referred to as the injection barrier and exit barrier, respectively. According to an embodiment of the invention, the active section may contain at least five of the QWs 26.

Figure 3:
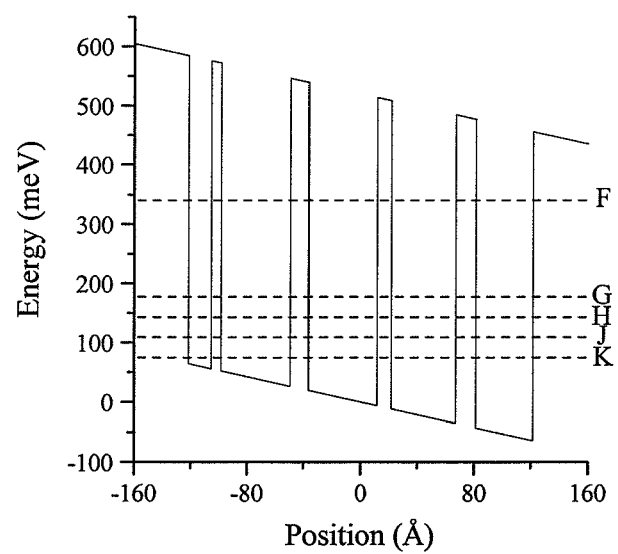
FIG. 3 is a plot of the conduction-band-edge energy of electrons in an active section of a QC laser according to an embodiment of the invention consisting of five QWs as a function of position (solid line), together with the subband-edge energies of five subbands F, G, H, J and K.

FIG. 3 shows a plot of the conduction-band-edge energy of electrons in an active section of a laser consisting of five QWs as a function of position (solid line), together with the subband-edge energies of five subbands F, G, H, J and K. The upper subband F corresponds to the injection energy of the electrons. The active electrons start from this subband and generate laser radiation upon passing into the middle subband G. The third lower subband K is separated from the previous lower subband J by an energy $E_{JK}$ which is substantially equal to $E_{GH}$ and to $E_{HJ}$ and, consequently, to the energy of the optical phonons emitted. The presence of the third lower subband K further reduces the population of subband G and consequently increases the population inversion between subbands F and G. The electric field and electrical current density required for the onset of lasing are lower than in conventional QC lasers. Furthermore, the lower electric field results in improved injector design, with a higher internal quantum efficiency per stage at higher operating temperatures.

The materials described herein are given as examples. Generally, the substrate can be any one of a number of suitable substrates for semiconductor epitaxial growth including InP, GaAs, GaSb, Si and the like. The upper and lower waveguide structures can be any suitably designed, epitaxially grown semiconductor single layers or multiple-layered structures that are approximately lattice matched to the chosen substrate and that have lower refractive indices at the operating wavelength than the active/gain region. The QW and QB materials in the active/gain region can be any suitable semiconductor materials that can be grown epitaxially on a chosen substrate, provided that the conduction-band-edge of the QB material is greater than that of the QW material. Although the number of QWs in one active section is five in the examples below, there can be fewer or more than five QWs in the active section. In one example, the QW and QB materials are lattice matched to the substrate. However, this is not a necessary requirement, and another example uses strained materials for these layers.

An embodiment of the invention was a five-QW-active-region design intended for an operating wavelength of 8 µm. The structure was grown by standard molecular beam epitaxy (MBE) techniques. Table 1 lists the structure of one active section of this laser.

TABLE 1

| Material composition (lattice matched) | Thickness (Å) | Comment; function; repeats |
|---|---|---|
| InAlAs | 49.76 | Injection barrier |
| InGaAs | 16.07 | |
| InAlAs | 7.00 | |
| InGaAs | 49.26 | |
| InAlAs | 12.83 | ↓ Direction of electron flow |

TABLE 1-continued

| Material composition (lattice matched) | Thickness (Å) | Comment; function; repeats |
|---|---|---|
| InGaAs | 48.23 | |
| InAlAs | 9.85 | |
| InGaAs | 45.31 | |
| InAlAs | 14.15 | |
| InGaAs | 40.43 | |
| InAlAs | 18.52 | Exit barrier |

Figure 4:
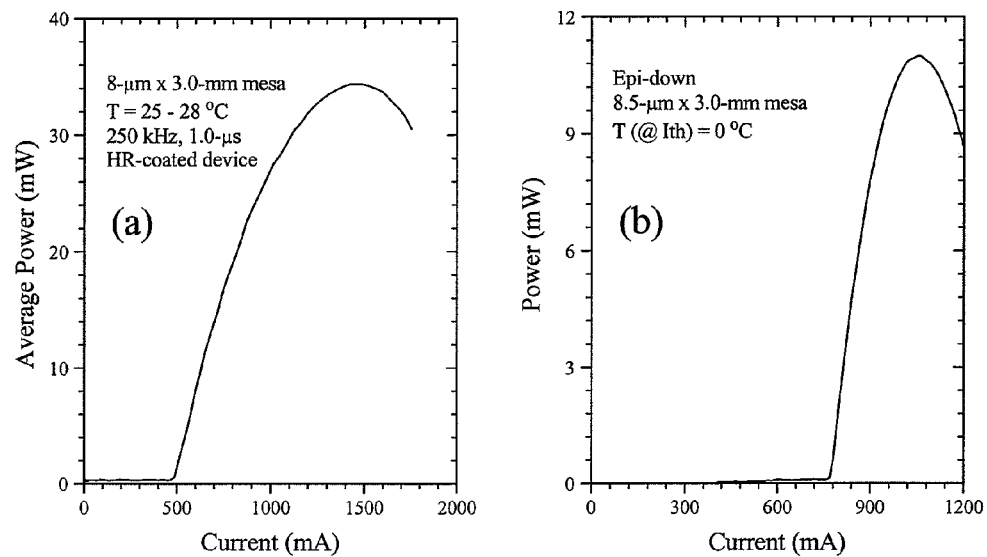
FIG. 4 illustrates representative results obtained from QC lasers fabricated in accordance with embodiments of the present invention.

FIG. 4 shows representative results obtained from lasers fabricated from the grown wafer. In plot (a) to the left in FIG. 4, the measured output power is shown as a function of the device current at room temperature for a device with a ridge width of 8 μm and a length of 3 mm fabricated from the wafer. The device is operated at a 25% duty cycle and produces a maximum average power of 34.3 mW at a drive current of 1455 mA. As more fully described below, plot (b) to the right in FIG. 4 shows that a different laser device with a ridge width of 8.5 μm and a length of 3 mm, fabricated from the same wafer and mounted epi-side down onto an AlN submount, operated in continuous-wave (cw) mode at a temperature of zero ° C., with a maximum power of 11.0 mW being obtained at a current of 1050 mA.

Figure 5:
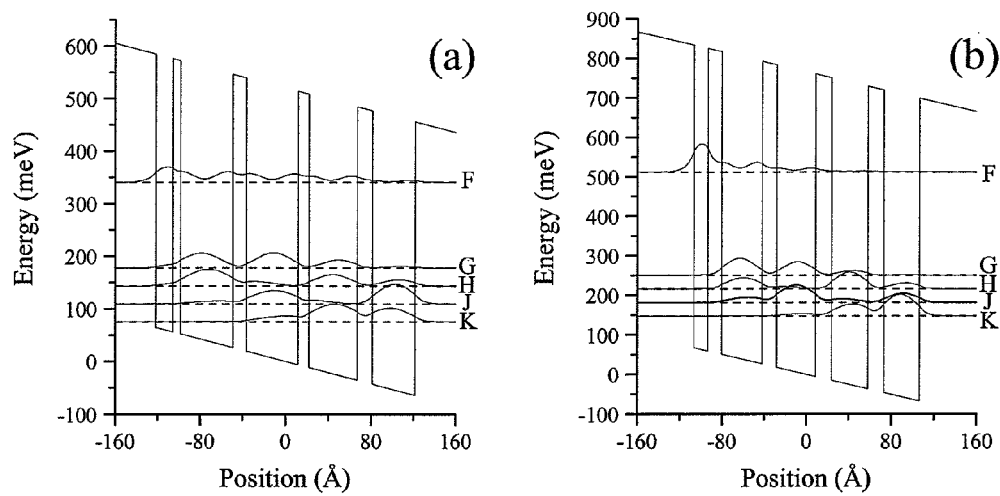
FIG. 5 are plots of position versus energy for a QC laser in accordance with embodiments of the present invention.

The left plot (a) in FIG. 5 illustrates one of the drawbacks in the design of the 8 μm QC laser that led to the results presented in FIG. 4(a). This plot is similar to that presented in FIG. 3 except that it shows the probability densities as functions of position corresponding to each of the calculated subband-edge energies. The probability densities, shown as solid curves associated with each subband, are plotted on a vertical scale that is shifted in origin to coincide with the subband-edge energies and magnified in scale. Of particular interest are the probability densities associated with the upper subband F and the lowest of the lower subband K. In the lower subband K, the probability density is highest in the second-to-last QW rather than in the last QW. The implication of this is that the rate of tunneling through the exit barrier and into the next downstream injector section is reduced compared to the rate that would be obtained if the probability density in the last well were higher. Consequently, the thickness of the exit barrier must be reduced to achieve the desired coupling between the two sections. However, the decreased barrier thickness results in an increased rate of carrier leakage, i.e., nonradiative decay of electrons from the upper subband F into subbands of the injector. Such increased carrier leakage results in decreased internal quantum efficiency of the laser. The probability density in the first well is also fairly low, which again necessitates a decrease in the thickness of the injection barrier in order to achieve the desired coupling between the active section and the preceding upstream injector section.

In accordance with an embodiment of the present invention, a triple-phonon-resonance design is implemented in a QC laser intended for operation at a wavelength of 4.8 μm. This design incorporates the desired enhancement of subband K's probability density in the last QW as well as fast decay by LO phonon scattering of the middle and lower subbands. The design uses strained layers as the QW and QB materials in order to achieve a deeper potential well for the electrons, which is necessary to achieve the shorter wavelength. The right plot (b) in FIG. 5 shows the structure of the active section in this new design, together with the relevant subband-edge energies and the corresponding probability densities. As can be seen in the plot, the probability densities for subband K in the last well and for subband F in the first well are substantially enhanced.

Table 2 lists the structure of one active section of the 4.8 μm QC laser.

TABLE 2

| Material composition (strained) | Thickness (Å) | Comment; function; repeats |
|---|---|---|
| $Al_{0.6219}In_{0.3781}As$ | 48.03 | Injection barrier |
| $Ga_{0.3089}In_{0.6911}As$ | 13.32 | |
| $Al_{0.6219}In_{0.3781}As$ | 13.00 | |
| $Ga_{0.3089}In_{0.6911}As$ | 38.46 | |
| $Al_{0.6219}In_{0.3781}As$ | 13.78 | ↓ Direction of electron flow |
| $Ga_{0.3089}In_{0.6911}As$ | 37.13 | |
| $Al_{0.6219}In_{0.3781}As$ | 15.30 | |
| $Ga_{0.3089}In_{0.6911}As$ | 34.09 | |
| $Al_{0.6219}In_{0.3781}As$ | 14.87 | |
| $Ga_{0.3089}In_{0.6911}As$ | 33.64 | |
| $Al_{0.6219}In_{0.3781}As$ | 21.27 | Exit barrier |

The design of the injector sections of the QC lasers may be optimized such that they result in the ability to operate the lasers at lower electric fields. The lower-field operation may result in significant reductions in carrier leakage and, therefore, significant improvement in laser threshold current and quantum efficiency. The injector design has a particularly significant effect on the reduction in electric field arising from the insertion of the extra subband K in the active section. For example, in the laser structure shown in Table 1, the predicted electric field at threshold is 53 kV/cm, whereas the corresponding electric field in the otherwise similar double-phonon-resonance design is 54.8 kV/cm. In the designs at the lower 4.8 μm wavelength, the predicted threshold field is 63 kV/cm, and the corresponding electric field in the otherwise similar double-phonon-resonance design is 68.9 kV/cm. Therefore, a larger reduction in electric field arising from the triple-phonon-resonance design is possible with the improved injector design.

Whereas particular embodiments of this invention have been described above for purposes of illustration, it will be evident to those skilled in the art that numerous variations of the details of the present invention may be made without departing from the invention as defined in the appended claims.

The invention claimed is:

1. A quantum cascade laser comprising:
    an active section comprising a plurality of quantum wells separated by quantum barriers which produce an energy level structure including:
        an upper laser level;
        a lower laser level; and
        at least three additional laser levels having lower energies than an energy of the lower laser level;
    barrier layers on opposite sides of the active section forming a waveguide that provides optical confinement for the active section; and
    current injectors structured and arranged to apply an electric control field to the active section.

2. The quantum cascade laser of claim 1, wherein the active section comprises at least five of the quantum wells.

3. The quantum cascade laser of claim 1, wherein the quantum wells comprise InGaAs.

4. The quantum cascade laser of claim 1, wherein the quantum barriers comprise InAlAs, InP and/or AlGaAs.

5. The quantum cascade laser of claim 1, wherein the quantum wells comprise InGaAs and the quantum barriers comprise InAlAs.

6. The quantum cascade laser of claim 1, wherein the barrier layers comprise multiple layers of InGaAs and InAlAs.

7. The quantum cascade laser of claim 1, wherein the current injectors comprise electrically conductive layers outside the barrier layers.

8. The quantum cascade laser of claim 1, wherein the energies of adjacent ones of the three additional laser levels and the energy of the lower laser level have differences that are equal to or greater than an energy of a longitudinal optical phonon of a material of the quantum wells.

* * * * *